United States Patent

Kommrusch

[11] Patent Number: 5,933,062
[45] Date of Patent: Aug. 3, 1999

[54] ACOUSTIC WAVE LADDER FILTER WITH EFFECTIVELY INCREASED COUPLING COEFFICIENT AND METHOD OF PROVIDING SAME

[75] Inventor: Richard S. Kommrusch, Albuquerque, N.M.

[73] Assignee: Motorola Inc., Schaumburg, Ill.

[21] Appl. No.: 08/963,800

[22] Filed: Nov. 4, 1997

[51] Int. Cl.[6] .............................. H03H 9/64; H03H 9/52
[52] U.S. Cl. ....................................... 333/193; 310/313 B
[58] Field of Search ..................................... 333/193–196, 333/188–190; 310/313 R, 313 B, 313 C, 313 D, 311, 314, 321

[56] References Cited

U.S. PATENT DOCUMENTS

| | | | |
|---|---|---|---|
| 2,222,417 | 11/1940 | Mason | 333/190 |
| 5,471,178 | 11/1995 | Hickernell | 333/193 |
| 5,600,287 | 2/1997 | Kwan et al. | 333/195 |
| 5,610,566 | 3/1997 | Chen et al. | 333/194 |
| 5,638,036 | 6/1997 | Penunuri et al. | 333/194 |

FOREIGN PATENT DOCUMENTS

| | | | |
|---|---|---|---|
| 6-21754 | 1/1994 | Japan | 333/193 |
| 6-53772 | 2/1994 | Japan | 333/193 |
| 6-61783 | 3/1994 | Japan | 333/193 |
| 6-260876 | 9/1994 | Japan | 333/193 |
| 7-231241 | 8/1995 | Japan | 333/193 |

OTHER PUBLICATIONS

Jumonji; "High–Impedance Piezoelectric Ceramic Resonators and Their Application to Ladder Filters"; *Electronics and Communications in Japan*, vol. 53–A, No. 8, 1970; pp. 17–23, Jan. 1970.

*Primary Examiner*—Robert Pascal
*Assistant Examiner*—Barbara Summons
*Attorney, Agent, or Firm*—Brian M. Mancini; Gary J. Cunningham

[57] ABSTRACT

An acoustic wave ladder filter (30) with lossy inductances (42) connected in parallel with resonators (40). Shunt sections (36,37) of the ladder filter (30) include impedance inverters having pass frequencies within the stopband of series resonators (33,34,35). The filter (30) additionally includes variable capacitors (44) connected in parallel with the inductances (42) to provide adjustment capabilities. The use of lossy inductances (42) actually increases effective coupling coefficient of the filter (30) and improves insertion loss thereby allowing improved design flexibility.

20 Claims, 3 Drawing Sheets

ACOUSTIC WAVE LADDER FILTER WITH EFFECTIVELY INCREASED COUPLING COEFFICIENT AND METHOD OF PROVIDING SAME

FIELD OF THE INVENTION

This invention relates in general to the field of radio frequency apparatus, in particular to radio frequency filters and more particularly to radio frequency filters employing acoustic waves.

BACKGROUND OF THE INVENTION

There is an ongoing need for component miniaturization in radio wave communication devices. For example, smaller and more efficient components are needed for light-weight, hand-portable cellular telephones, wireless local area networks for linking computer systems within office buildings in a readily reconfigurable fashion, wristwatch- and creditcard-sized paging apparatus and other devices for promoting rapid, efficient and flexible voice and data communication.

Filters are needed for a variety of such communications applications wherein small size, light weight and high performance are simultaneously required. Increasing numbers of products seek to employ fixed spectral resources, often to achieve tasks not previously envisioned. Examples include cellular telephones, inter- and intra-facility computer-computer and/or computer-ancillary equipment linkages as well as a host of other, increasingly complex inter-personal and/or -equipment information sharing requirements. The desire to render increasingly complicated communications modes portable and even hand-held and/or -portable and/or pocket-sized places extreme demands on filtering technology in the context of increasingly crowded radio frequency resources.

Acoustic wave filters must meet stringent performance requirements including (i) being extremely robust, (ii) being readily mass produced, (iii) and sharply increasing the performance to size ratio achievable in the frequency range extending from a few tens of MegaHertz to about several GigaHertz. However, there is a need for low passband insertion loss simultaneously coupled with demand for high shape factor and wide bandwidth which is not easily met by acoustic wave filters.

Hypothetically, one approach to satisfying these needs and demands is to use a substrate with an exceptionally high coupling coefficient. This approach would realize an increased bandwidth and improved shape factor. However, existing substrates are limited in the level of available electromechanical coupling coefficient ($k^2$).

Another approach is to provide two or more such filters on a single substrate. One realization includes a series-parallel arrangement of resonant elements arranged in a ladder structure, i.e., a structure comprising cascaded sections each including a series resonant element followed by a shunt resonant element. Typically, within each section, the anti-resonant frequency of the shunt element is chosen to be the resonant frequency of the accompanying series element, providing pure real input and output impedances. The disadvantage of this approach includes a fixed bandwidth for the coupling coefficient ($k^2$) associated with the chosen substrate material.

Prior art ladder filter structures employing piezoelectric series and/or shunt elements have generally been confined to extremely narrow bandwidths, on the order of 0.01% to 0.1%, in part because they have been implemented with piezoelectric materials having very low electromechanical coupling coefficients. Generally, conventional approaches are such that when three of: the filter material, the impedance, the selectivity and the bandwidth are specified, the fourth is also determined.

What is needed is a ladder filter configuration/ design methodology providing flexible bandwidth, suitable out-of-band rejection and low in-band insertion loss, not requiring external matching components, and realizable in compact, monolithic form.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference characters refer to similar items throughout the figures, and:

The exemplification set out herein illustrates a preferred embodiment of the invention in one form thereof, and such exemplification is not intended to be construed as limiting in any manner.

DETAILED DESCRIPTION OF THE PREFERRED EMBODIMENT

Figure 1:
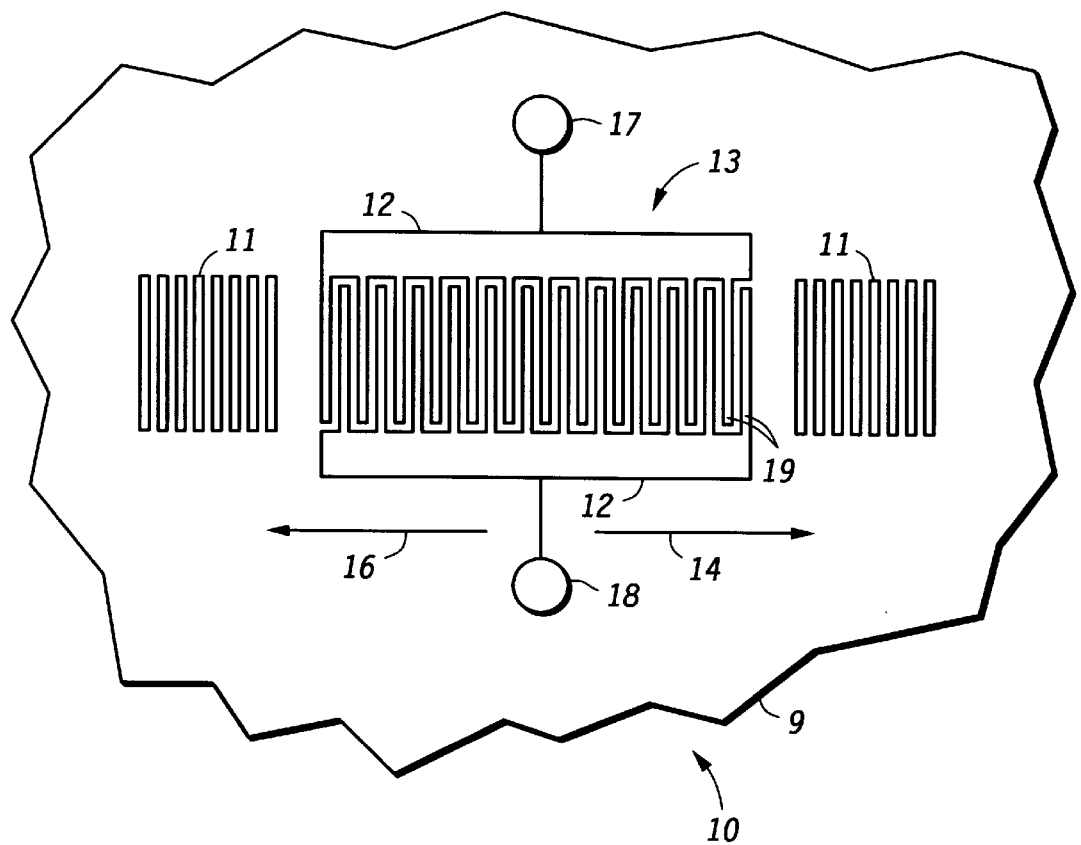
FIG. 1 is a simplified plan view of an acoustic wave resonator including optional reflectors.

FIG. 1 is a simplified plan view of a prior art acoustic wave resonator 10 including an acoustic wave transducer 13 comprising interdigitated electrodes 19 (also referred to herein an "fingers", "finger electrodes", etc.) coupled alternately to a first terminal 17 or a second terminal 18 via respective bus bars 12, 12'. The resonator 10 optionally includes reflectors 11, 11' disposed to either side of the transducer 13 in principal directions 14, 16 of acoustic wave propagation. The reflectors 11, 11' typically comprise metal electrodes analogous to electrodes 19 that are either electrically isolated one from another or coupled to only one of the bus bars 12, 12' within a particular reflector 11, 11' or which may be electrically connected together within a particular reflector 11, 11' but not electrically connected to features outside of that particular reflector 11, 11'.

The electrodes 19 typically are periodic and define a particular acoustic wavelength at which the transducer 13 exhibits a characteristic acoustic center frequency together with a center frequency wavelength for the acoustic energy transduced in response to electrical stimulation of an appropriate frequency applied via terminals 17, 18. The electrodes 19 are usefully one-fourth of this center frequency wavelength wide, i.e., measured along directions in accordance with design principles and performance objectives for the resonator 10. The electrodes are disposed on one-half acoustic wavelength centers, usually alternately coupled to their associated bus bars 12, 12' respectively.

Electrical stimulation at an appropriate frequency supplied from electrical terminals 17, 18 to bus bars 12, 12' and thence to interdigitated or interleaved electrodes 19 results in acoustic waves being generated within transducer 13. Similarly, acoustic waves of an appropriate frequency impinging upon electrodes 19 result in electrical signals being manifested at terminals 17, 18. As used herein, the term "acoustic wavelength" is taken to mean an acoustic wavelength at the filter center frequency, i.e., in the nominal center of the filter passband.

The reflectors 11,11' typically include electrodes or other reflective structures one-fourth of this wavelength wide, i.e., measured along directions 14, 16, because electrodes of this width tend to be reflective. However, other widths providing suitable reflection characteristics may be employed and this width may be chosen to accommodate the reflection characteristics of the materials employed for the resonator 10, including a substrate 9.

The resonator 10 is typically fabricated on a polished surface of a substrate 9 by depositing and patterning a thin metal film, often comprising aluminum, in a thickness ranging from about 50 nm (500 Å) to about 600 nm (6000 Å) thick, by techniques similar to those employed in integrated circuit manufacturing, and directions 14, 16 are carefully aligned with a preferred crystallographic axis providing the desired acoustic transduction, propagation and reflection characteristics.

Figure 2:
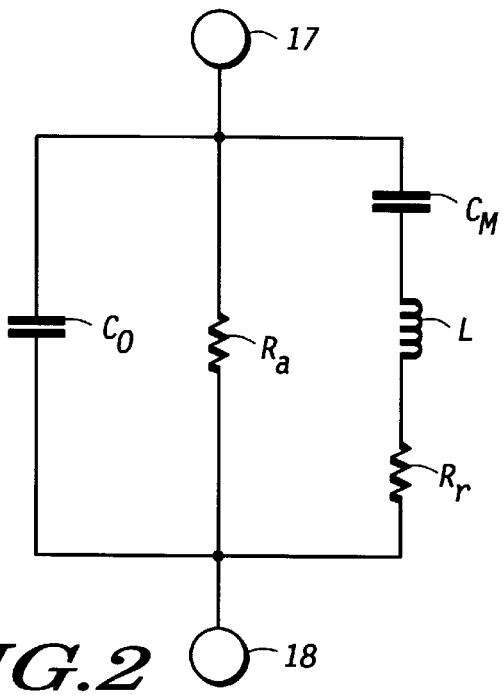
FIG. 2 is a schematic diagram of a simplified equivalent circuit for the resonator of FIG. 1.

FIG. 2 is a schematic diagram of a simplified equivalent circuit for the SAW resonator 10 of FIG. 1 which is conveniently modeled as a series RLC circuit (e.g., a resistor of resistance $R_r$ having one lead coupled to terminal 18 of FIG. 1, in series with an inductor having inductance L, in turn coupled in series with a capacitor having motional capacitance $C_m$ and having a second lead coupled to terminal 17) bridged by a capacitor having a larger capacitance $C_o$ (i.e., coupled from terminal 17 to terminal 18). Values for components $C_o$, $C_m$, L, $R_r$ are found from Eqs. 1–3 (infra), the geometry of transducer 13 and relevant material constants. $R_r$ may be usefully estimated as zero (i.e., ignored) or may be modeled from empirical data. Values of a few ohms are often encountered in practice. $R_r$ represents bulk wave radiation, acoustic propagation away from the receiving transducer, metal resistivity, diffraction effects and other losses encountered in acoustic resonant elements. Resistance $R_r$ is related to the resonant Q of the resonator. Resistance $R_a$ has been added when the antiresonant Q must be considered. $R_a$ may be usefully estimated as infinite or may be modeled from empirical data. Static capacitance $C_o$ is found from:

$$C_o = C_e N W \quad (1)$$

where $C_e$ is a material parameter describing capacitance per finger pair per cm (tabulated for many materials in a variety of textbooks), N represents the number of transducer finger pairs (e.g., pairs of electrodes 19 in transducer 13, FIG. 1) and W represents the overlap of electrodes 19 or beamwidth in cm.

Motional capacitance $C_m$ is related to static capacitance $C_o$ by:

$$C_m = \frac{8k^2 C_o}{\pi^2} \quad (2)$$

where $k^2$ represents the electromechanical coupling coefficient (tabulated in a variety of textbooks related to piezoelectric materials). Motional inductance L is given by:

$$L = \frac{1}{C_m \omega_r^2} \quad (3)$$

where $\omega_r$ represents the radian transducer resonant frequency.

Admittance Y measured between terminals 17, 18 of FIG. 1 is:

$$Y = j\omega C_o + \frac{1}{R + j(\omega L - (1/\omega C_m))} \quad (4)$$

Admittance Y has resonant frequency $\omega_r$, usually close to and slightly lower than the acoustic center frequency (approximately the sound velocity divided by the acoustic wavelength associated with the periodicity of electrodes 19 of the transducer 13):

$$\omega_r = \frac{1}{\sqrt{LC_m}} \quad (5)$$

and antiresonant frequency, $\omega_a$:

$$\omega_a = \omega_r \sqrt{1 + C_m/C_o} \quad (6)$$

or $$\omega_a = \omega_r \sqrt{1 + 8k^2/\pi^2} \quad (7)$$

For a given transducer 13, antiresonant frequency $\omega_a$ is always greater than resonant frequency $\omega_r$ by a ratio determined by electromechanical coupling coefficient $k^2$ (Eq. 7). The ratio, $C_m/C_o$, is proportional to coupling coefficient $k^2$ (Eq. 2). Therefore, by increasing $C_m$ or reducing $C_o$ the coupling coefficient can be effectively increased.

In traditional acoustic filters employing ST-cut quartz resonant elements, electromechanical coupling coefficient $k^2$ is typically much smaller than 0.5%, limiting the fractional bandwidth (bandwidth divided by center frequency) achievable for such filters to very small values. In the present invention, although ST-cut quartz may be utilized, it is preferable to use higher coupling coefficient materials (e.g., $LiNbO_3$, $LiTaO_3$, etc.) which provide a greater spread between resonant and antiresonant frequencies. For example, 64° $LiNbO_3$ provides a coupling coefficient in the range of from 9% to 13% (nominally about 10.5%), 41° $LiNbO_3$ provides coupling coefficients in the range from 15–25% (nominally about 17%) and 36° $LiTaO_3$ provides coupling coefficients in the range from 6.5–8% (nominally about 7.5%). This increased frequency spread in turn allows further design freedom.

In a circuit, where a SAW resonator is used in series between a generator and load, it produces a passband about $f_a$ when the series elements goes resonant, and a stopband about $f_s$, above $f_a$ when $C_o$ goes anti-resonant with the effective inductance of the series $RLC_m$. The separation of $f_a$ and $f_s$ is a function of the ratio $C_m/C_o$, and if the ratio is made effectively larger by making $C_o$ effectively smaller the separation between $f_a$ and $f_s$ will increase. Now when a inductor is added in parallel across the SAW it can be thought of as reducing $C_o$ at a given frequency, i.e. the inductor looks like a negative capacitor over a small frequency range, this in turn increases the ratio $C_m/C_o$ and the separation between $f_a$ and $f_s$.

The present invention further increases the effective coupling coefficient by reducing $C_o$ (see Eq. 2) This reduction is accomplished by the coupling of an inductance to the resonator. The reactance of the inductor serves to reduce $C_o$. A high coupling coefficient translates into improved insertion loss with a wide bandwidth and increased range of SAW filter design flexibility. Surprisingly, it was found that the use of a lossy inductance can still provide improved insertion loss. Moreover, the Q of the lossy inductor can be chosen to be lower than a Q of an associated resonator with the resulting insertion loss of the filter still being improved.

Generally, the present invention provides a method and apparatus for improving bandwidth and insertion loss in acoustic wave (e.g., SAW, surface skimming bulk wave, leaky wave etc.) filters without the need for high electrical coupling coefficient substrates.

Figure 3:
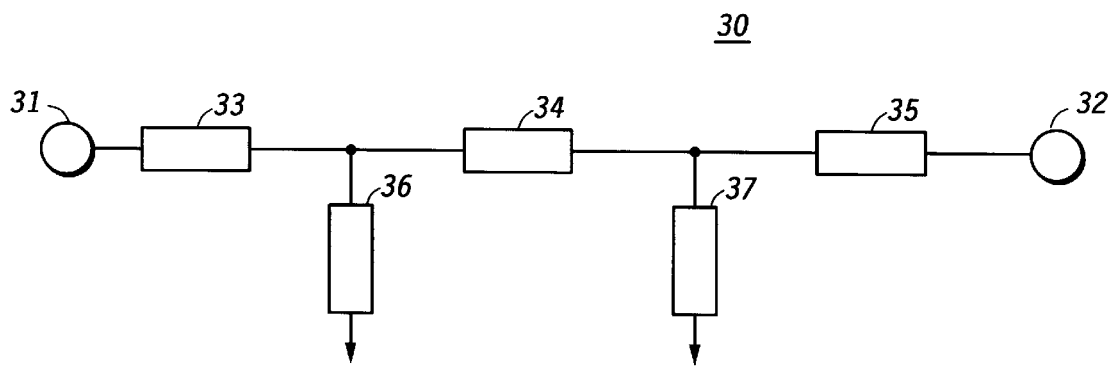
FIG. 3 is a simplified schematic view of a ladder filter, in accordance with the present invention.

FIG. 3 is a simplified schematic view of five element ladder filter 30 having first and second ports 31, 32 in accordance with the present invention, although it is possible to provide a ladder filter having as little as one series element and one shunt element. As the number of elements increase the insertion loss degrades, but the shape factor improves. Therefore, it is desired to use the minimum number of element necessary to provide the desired shape factor. The ladder filter 30 is typically specified to have a passband bandwidth about a center frequency, $f_o$, and comprises at least one series resonator coupled in series between the first and second ports and at least one shunt section coupled in shunt at a terminal of a series resonator.

For cellular phone applications, it is preferred to provide five elements to achieve the proper shape factor: three series resonators 33, 34, 35 and two shunt sections 36, 37, as shown. In one embodiment, the series resonators 33 and 35 may be chosen to be nominally identical and similarly the shunt sections 36 and 37. The three series resonators 33, 34, 35 are coupled in series between the first and second ports 31, 32. The shunt sections are coupled between the series resonators. For example, shunt section 36 is coupled in shunt between series resonators 33 and 34, and shunt section 37 is coupled in shunt between series resonators 34 and 35 as shown.

The series resonators 33, 34, 35 can be chosen to have a narrower bandwidth and a corresponding inductive impedance characteristic over at least a portion of the filter passband in accordance with the present invention. In this scenario, the shunt sections 36, 37 are chosen to have broader bandwidth and correspondingly capacitive impedance characteristic over the same filter passband portion such that the inductive characteristic of series resonators 33, 34, 35 essentially cancels capacitive contributions from the shunt sections 36, 37.

Alternatively, the series resonators 33, 34, 35 can be chosen to represent a broader bandwidth and a capacitive impedance characteristic over a portion of the filter passband. The shunt sections 36, 37 are then chosen to provide a narrower passband and an inductive impedance over a portion of the filter passband, with the capacitive impedance component of series resonators 33, 34, 35 essentially canceling the inductive contributions from the shunt sections 36, 37 over at least part of the filter passband.

In general, the combined reactive impedances of any of the resonator or sections can contribute in essentially equal parts, or can depend more heavily on one resonator or section than another, or can be essentially derived from only a subset of resonators or sections. Further, when a complex load or source impedance is desired or required, the combined impedances may be chosen to provide a complex conjugate match thereto.

In prior art ladder filters each of the series resonators 33, 34, 35 and shunt sections 36, 37 consist of a SAW resonator as shown in FIG. 2. Typically, prior art ladder filters employ elements wherein the resonant frequency of the series elements are chosen to be equal to the antiresonant frequencies of the shunt elements. In traditional narrow-band crystal lattice filters employing quartz resonant elements, electromechanical coupling coefficient $k^2$ is typically much smaller than 0.5%, limiting the fractional bandwidth (bandwidth divided by center frequency) achievable for such filters to very small values.

Using higher coupling coefficient materials (e.g., $LiNbO_3$, $LiTaO_3$ etc.) provides an increased spread between resonant and antiresonant frequencies. For example, 64° $LiNbO_3$ provides a coupling coefficient in the range of from 9% to 13%, 41° $LiNbO_3$ provides coupling coefficients in the range from 15–25% and 36° $LiTaO_3$ provides coupling coefficients in the range from 6.5–8%. This increased frequency spread improves design freedom, but the modern trend is towards increasing bandwidths requiring higher coupling coefficients which are difficult or impossible to obtain for a large bandwidth.

Applicant has discovered that the addition of a lossy inductance coupled to at least one of the series resonators and shunt sections effectively improves the coupling coefficient of the associated resonator, thereby providing reduced insertion loss at and near the filter center frequency $f_o$ and greater flexibility in filter bandwidth selection. In addition, it was found that the Q of the lossy inductance can be lower than the Q of the associated resonator without sacrificing performance.

Figure 4:
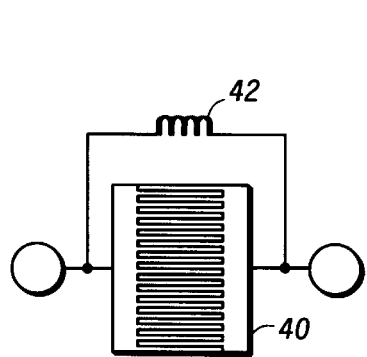
FIG. 4 is a simplified schematic view of a resonator coupled with an inductor, in accordance with the present invention.

Referring to FIG. 4, the present invention includes at least one of the series resonators 40 of the ladder filter being coupled with an inductance 42. This improves the effective coupling coefficient of the associated resonator which in turn improves the overall insertion loss of the ladder filter. Preferably, all of the series resonators are coupled with an inductance.

Figure 5:
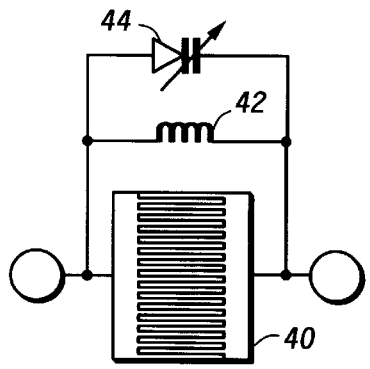
FIG. 5 is a simplified schematic view of a resonator coupled with an inductor and an adjustable capacitor, in accordance with the present invention.

More preferably, the inductance 42 coupled with the resonator 40 is further coupled with a variable capacitance 44, as shown in FIG. 5, with the combination of the inductance 42 and capacitance 44 being inductive to retain the effect of reducing the static capacitance of the resonator 40. The capacitance 44 is used to effectively tune the inductance 42, as seen by the resonator, to optimize the overall shape factor of the ladder filter.

In operation, the inductance includes an inductor coupled with a capacitance selected from the group consisting of a capacitor, a trimmable capacitor, diode switchable capacitors, a varactor, and a voltage variable capacitor (VVC). Preferably, the capacitance is a VVC. It should be recognized that various combinations of inductances and capacitances can be applied to each resonator to reduce the static capacitance of the resonator. In addition, these inductances and/or capacitances can be applied individually or in combination at each leg of the ladder filter.

In the present invention, the ladder filter incorporates with an impedance inverter which is operable within the passband. An inverter can be any reactive element whose reactance changes relatively slowly within the frequency band of interest, i.e. no resonance or anti-resonance point within the frequency band of interest. In the present invention, the impedance inverter is selected from one of the group consisting of a capacitor, an inductor, a quarter-wave transmission line, a transformer, and another resonator.

In a first embodiment of the present invention, the shunt section includes an impedance inverter having a stop frequency within the stopband of the ladder filter and a pass frequency that is lower than the stop frequency, the ladder filter operable as a substantially high-pass filter. Preferably, the impedance inverter is an inductive inverter being another resonator. However, this function can also be performed by a simple inductor. An inductive impedance inverter can work in the present invention, but they tend to be larger and have more loss than an capacitive impedance inverter.

In a second embodiment of the present invention, the shunt section (36,37 as shown in FIG. 3) includes a impedance inverter having a stop frequency within the stopband of the ladder filter and a pass frequency that is higher than the stop frequency, the ladder filter operable as a substantially low-pass filter. The impedance inverter is selected from one of the group consisting of a capacitor, an inductor, a quarter-wave transmission line, a transformer, and an additional resonator. Preferably, the impedance inverter is a capacitive inverter being another resonator. However, this function can also be performed by a simple capacitor.

In the first and second embodiments of the present invention, it is preferred that, the shunt sections are resonators coupled with a parallel inductance similar to the series inductors, as represented in FIG. 4. More preferably, the shunt sections are further coupled with a capacitance, as represented in FIG. 5. The application, reasons and benefits for using inductances and capacitances are the same as was presented above and the arguments presented therein are hereby incorporated by reference.

In a preferred embodiment, the series resonators are coupled in parallel with an inductor and a VVC. The VVC provides filter shape factor adjustability in addition to the benefits attributed to the embodiments above. Moreover, the adjustability allows the use of a lower shape factor ladder filter than prior art applications require, in that, the filter can now be tuned to reduce insertion loss. More preferably, the shunt sections are capacitors. This reduces the size of the ladder filter while retaining improved effective coupling coefficient within the passband of the ladder filter which improves overall filter insertion loss.

Starting with a filter specification which has a passband and a stopband separated by a transition-band, consider a duplex radio requirement of protecting the receiver from undesired transmitter power over the bands of interest: 25 MHz at 824–849 MHz and 25 MHz at 869–894 MHz. The transition-band is then 20 MHz at 849–869 MHz. In actual operation the radio only needs protection for a single 30 kHz channel at a time and the required transition band is effectively 45 MHz.

In addition, given the fact that for a given filter topology and given resonator elements with given Q, a filter's loss will be governed by the most confining part of the spec. In the above case the transition band is the most confining part of the spec. and a tunable filter would allow the use of larger transition bands.

In a typical filter, a doubling of the bandwidth of the governing band, in our case the transition band, cuts the insertion loss in half, thus if the added components (inductors, VVC's and/or other switching devices), cause a decrease of resonator Q of about 20% a net reduction of insertion loss is still possible.

Figure 6:
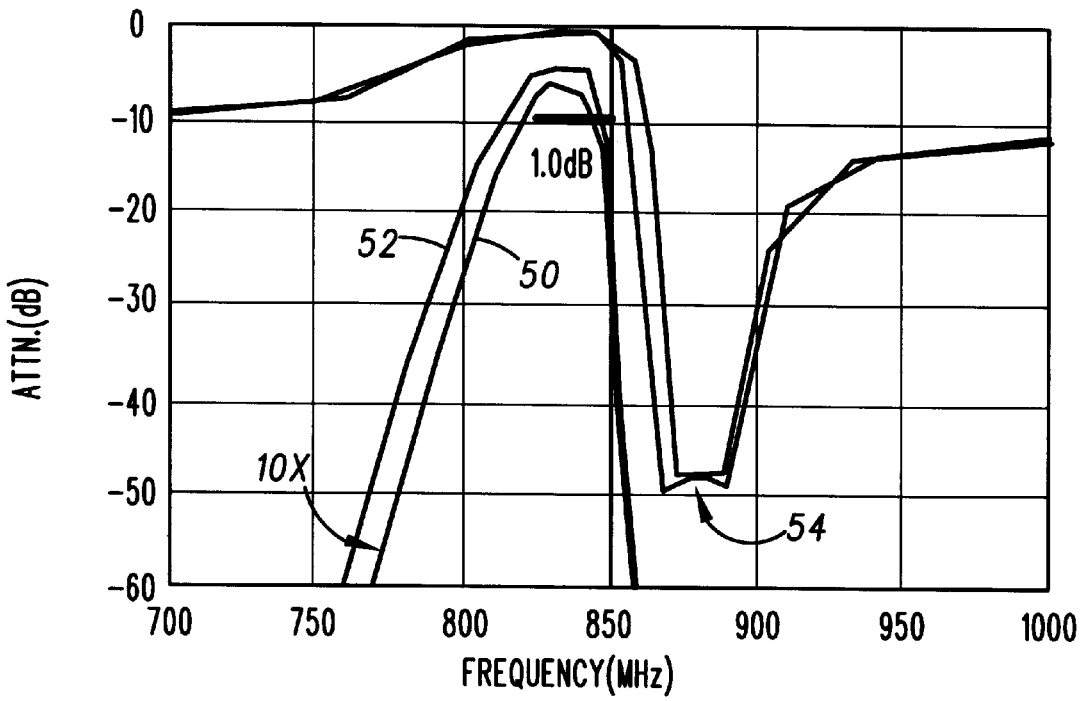
FIG. 6 is a graph of calculated frequency response for a ladder filter built with a parallel inductance, in accordance with the present invention.

FIG. 6 is a graph of calculated frequency response for a five element ladder low-pass filter built with lossy inductors coupled in parallel with the resonators, in accordance with the present invention, as compared with the same ladder filter without the coupled inductors. The ladder filter was designed at 830 MHz on a substrate having a ratio of capacitances, $C_m/C_o$, (related to coupling coefficient) of 0.10 (41 to 64 degree lithium niobate). The resonators were assumed to have a resonant Q of 400, and an antiresonant Q of 250. The addition of the inductors was assumed to reduce the static capacitance of the resonators by about one-half.

The passband frequency response of the filter without the inductors is shown (magnified 10×) by curve 50. This shows an insertion loss of about 0.7 dB. The improved filter response using the parallel coupled inductors is shown by curve 52. As can be seen, the insertion loss is improved by about 0.2 dB to 0.5 dB. This improvement occurs even where the inductors have a lower Q than the resonators. In cases where higher Q inductors are used the improvement in insertion loss would be even greater. Furthermore, the ratio of capacitances, $C_m/C_o$, (related to coupling coefficient) is calculated to have effectively improved to about 0.16. In addition, the improved filter is also able to meet the −40 dB specification in the stopband 54.

Figure 7:
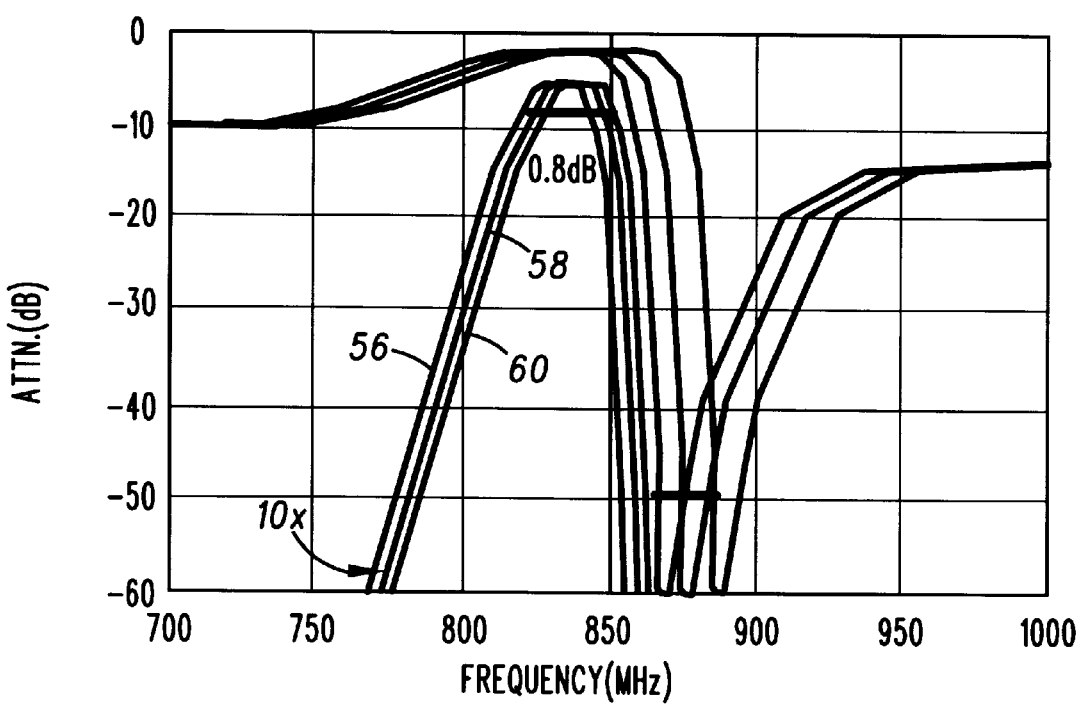
FIG. 7 is a graph of calculated frequency response for a ladder filter built with a tunable inductance, in accordance with the present invention.

FIG. 7 is a graph of calculated frequency response for a five element ladder low-pass filter built with lossy inductors and variable capacitors coupled in parallel with the resonators, in accordance with the present invention. The ladder filter was designed similarly to the representation of FIG. 6 which is hereby incorporated by reference. The Q of the inductor and variable capacitor was about 150 in this example. The leftmost curve 56 shows the response without the tuning capability. The two rightmost curves 58,60 show increasing tuning. As can be seen, the additional ability of tuning further improves insertion loss over the already improved example of FIG. 6.

In practice, this example can be realized in a multilayer ceramic integrated circuit packaging configuration with variable capacitances (preferably VVCs) mounted on the exterior of the packaging and connecting to the SAW resonator mounted within the packaging.

The calculated characteristics provide "room" for temperature-induced and other environmentally-induced changes in filter characteristics and also allow for manufacturing-induced device-to-device variations which may influence characteristics of as-built devices, providing a robust and manufacturable filter design.

Ladder filters using surface acoustic wave resonators and specially resonators designed for relatively wide-band performance may be readily scaled in frequency by changing the pitch (periodicity) of the resonator transducer fingers (19, FIG. 1) while maintaining the ratios of the resonant frequencies $\omega_r$ obtained from circuit analysis tools or other methods. This allows a designer to re-use a similar design at a slightly different center frequency $f_o$ having similar specifications or permits a quick, two iteration convergence to a desired set of filter characteristics when the relationship between the resonant frequency $\omega_r$ and the transducer acoustic center frequency is not known a priori (e.g., on very high coupling coefficient materials where conventional approximations tend to provide poorer design guidance).

In application, the ladder filter of the present invention is incorporated within a multilayer ceramic integrated circuit for use in a wireless communication device. The combination of the SAW filter and the multilayer ceramic circuitry provide the best in size and performance required for today's wireless radios.

Figure 8:
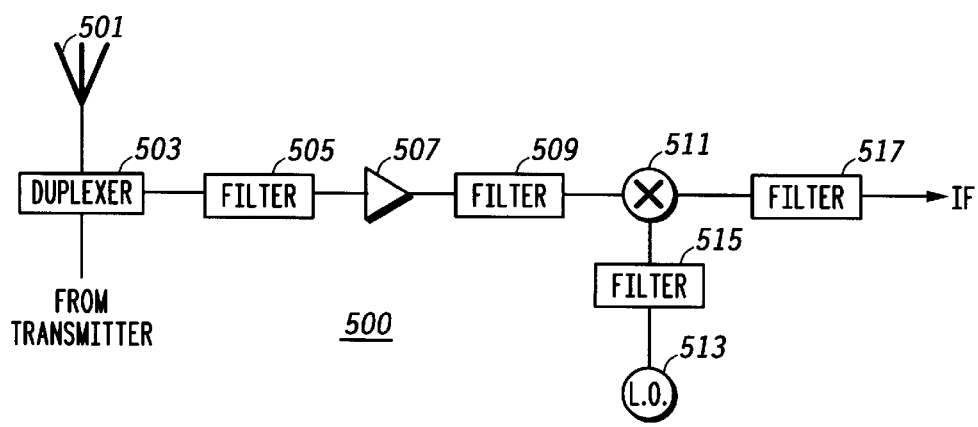
FIG. 8 is a block diagram of a portion of a radio frequency apparatus including a ladder filter, in accordance with the present invention.

FIG. 8 is a block diagram of a portion 500 of a radio frequency receiver or other communication device including acoustic wave filters, in accordance with the present invention. The portion 500 of the radio apparatus includes an antenna 501, by way of example, used to receive and/or transmit signals. Alternatively, the antenna 501 could be replaced by a fiber-optic link, cable or other signal transmissive media. A duplexer 503 is coupled to the antenna 501 and to a transmitter portion (not shown). The duplexer 503 is a special purpose filter which couples signals to a filter 505. Filter 505 can stand alone or be included within the duplexer 503. The filter 505 and duplexer 503 allow a transmitter and receiver operating in different frequency bands to couple to a common port while remaining isolated from each other. The filter 505 is coupled to an amplifier 507. An output of the amplifier 507 is transmitted to a filter 509 according to the present invention. The filter 509 transmits a signal to a mixer 511. The signal from filter 509 is combined in the mixer 511 with another signal from a local oscillator 513 coupled via a filter 515. An output signal from the mixer 511 is then filtered by a filter 517 to provide an IF output signal. The arrangement of the present invention may be used to provide any or all of the filters 505, 509, 515, 517. An oscillator and filter analogous to the local oscillator 513 and filter 515 may be employed together with a suitable amplifier and modulator to provide the signal "FROM TRANSMITTER" and this filter (known as a "transmit clean-up filter") as well may be provided in accordance with the present invention. One or more of the filters 505, 509, 515, 517 incorporate the ladder filter of the present invention. Preferably, the duplexer 503 incorporates the ladder filter of the present invention on its transmitting side.

Thus, an acoustic filter has been described which overcomes specific problems and accomplishes certain advantages relative to prior art methods and mechanisms. The improvements over known technology are significant. The problems of prior art filters are avoided. Further, improved insertion loss is realized for compact and lightweight filters together with improved design flexibility.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the broad scope of the appended claims.

What is claimed is:

1. An acoustic wave ladder filter with a first port and a second port and having a passband about a center frequency, the ladder filter comprising:
   at least one series resonator coupled in series between the first and second ports;
   at least one shunt section coupled in shunt at a terminal of the at least one series resonator; and
   an inductance coupled in parallel with each of at least one of the series resonators and shunt sections, the inductance decreasing the capacitance ratio of each of the at least one of the series resonators and shunt sections such that the coupling coefficient of the at least one of the series resonators and shunt sections is effectively increased.

2. The filter of claim 1, wherein the ladder filter incorporates an impedance inverter which is operable within the passband, the impedance inverter is selected from one of the group consisting of a capacitor, an inductor, a quarter-wave transmission line, a transformer, and another resonator.

3. The filter of claim 1, wherein each of the at least one shunt section includes a capacitive inverter being a resonator having a stop frequency within the stopband of the ladder filter and a pass frequency that is higher than the stop frequency, the ladder filter operable as a substantially low-pass filter.

4. The filter of claim 1, wherein each of the at least one shunt section includes a capacitive inverter being a sole capacitor, the ladder filter operable as a substantially low-pass filter.

5. The filter of claim 1, wherein each of the at least one shunt section includes an inductive inverter being a resonator having a stop frequency within the stopband of the ladder filter and a pass frequency that is lower than the stop frequency, the ladder filter operable as a substantially high-pass filter.

6. The filter of claim 1, wherein the inductance includes an inductor having a Q that is lower than a Q of the associated resonator.

7. The filter of claim 1, wherein the series resonators are chosen to have a narrow first bandwidth and a corresponding inductive impedance characteristic over at least a portion of the filter passband and the shunt sections are chosen to have second bandwidth broader than the first bandwidth and a correspondingly capacitive impedance characteristic over the portion of the filter passband such that the inductive characteristic of series resonators essentially cancels the capacitive impedance from the shunt sections.

8. The filter of claim 1, wherein the ladder filter includes a plurality of inductances such that an inductance is coupled in parallel with each of the series resonators.

9. The filter of claim 8, wherein each of the at least one shunt sections are resonators coupled in parallel with an inductance.

10. The filter of claim 1, wherein the series resonators are chosen to have a broad first bandwidth and a capacitive impedance characteristic over a portion of the filter passband and the shunt sections are chosen to provide a second passband narrower than the first passband and an inductive impedance over the portion of the filter passband, the capacitive impedance characteristic of series resonators essentially canceling the inductive impedance from the shunt sections over at least part of the filter passband.

11. An acoustic wave low-pass ladder filter with a first port and a second port and having a passband about a center frequency and a stopband above the passband, the ladder filter comprising:
   at least two series resonators coupled in series between the first and second ports;
   at least one shunt section coupled in shunt at a terminal between the at least two series resonators, at least one of the at least one shunt section including a capacitive inverter operable within the passband; and
   an inductance coupled in parallel with each of the series resonators, the inductance decreasing the capacitance ratio of the series resonators such that the coupling coefficient of the series resonators are effectively increased.

12. The filter of claim 11, wherein the capacitive inverter includes an inductance coupled with a resonator having a stop frequency within the stopband of the ladder filter and a pass frequency that is higher than the stop frequency.

13. The filter of claim 11, wherein the capacitive inverter is a sole capacitor.

14. The filter of claim 11, wherein the inductance includes an inductor having a Q that is lower than a Q of the associated resonator.

15. A method for increasing an effective coupling coefficient of an acoustic wave ladder filter having a passband about a center frequency and having a first port and a second port, said method comprising the steps of:

providing a piezoelectric substrate with resonators disposed in legs of a ladder network configuration;

configuring one of the legs of the ladder network to be operable as an impedance inverter within the passband of the ladder filter; and connecting an impedance with at least one of the resonators such that the impedance decreases the capacitance ratio of the at least one of the resonators such that the coupling coefficient of the at least one of the resonators is effectively increased.

16. The method of claim 15, wherein the configuring step includes configuring a resonator to be operable as a capacitive inverter in a leg of the ladder filter.

17. The method of claim 16, wherein the configuring step includes the resonator having a stop frequency within a stopband of the ladder filter and a pass frequency that is higher than the stop frequency of the resonator.

18. The method of claim 16, wherein the configuring step includes configuring one of the legs of the ladder network to be a capacitor.

19. The method of claim 15, wherein the connecting step includes an inductor having a Q that is lower than a Q of the associated resonator.

20. A radio communication device having a receiver, transmitter and a duplexer and including an acoustic wave filter, comprising:

an acoustic wave ladder filter with a first port and a second port and having a passband about a center frequency, the ladder filter comprising:

at least one series resonator coupled in series between the first and second ports;

at least one shunt section coupled in shunt at a terminal of the at least one series resonator; and an inductance coupled in parallel with each of at least one of the series resonators and shunt sections, the inductance decreasing the capacitance ratio of each of the at least one of the series resonators and shunt sections such that the coupling coefficient of the at least one of the series resonators and shunt sections is effectively increased.

* * * * *